United States Patent
Choi et al.

(10) Patent No.: US 8,923,462 B2
(45) Date of Patent: Dec. 30, 2014

(54) DEVICE AND METHOD FOR CORRECTING DUTY CYCLE, AND RECEIVER INCLUDING THE SAME

(71) Applicant: Industry-Academic Cooperation Foundation, Yonsei University, Seoul (KR)

(72) Inventors: Woo-Young Choi, Seoul (KR); Wang-Soo Kim, Seoul (KR)

(73) Assignee: Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 13/768,816

(22) Filed: Feb. 15, 2013

(65) Prior Publication Data

US 2014/0169435 A1  Jun. 19, 2014

(30) Foreign Application Priority Data

Dec. 18, 2012  (KR) .......................... 10-2012-0148658

(51) Int. Cl.
*H04L 7/00* (2006.01)
*H03K 3/017* (2006.01)
*H04L 27/01* (2006.01)
*H03K 5/156* (2006.01)
*H04L 25/49* (2006.01)

(52) U.S. Cl.
CPC .............. *H04L 27/01* (2013.01); *H03K 5/1565* (2013.01); *H04L 25/4902* (2013.01)
USPC .......................................... 375/354; 327/175

(58) Field of Classification Search
CPC ....... H03K 5/1565; H03K 5/086; H03K 7/08; H03K 3/017; H03C 2200/0045
USPC .................... 375/229, 238, 254; 327/172–175
See application file for complete search history.

(56) References Cited

U.S. PATENT DOCUMENTS 4,694,468 A * 9/1987 Cullum ........................ 375/224
5,543,793 A * 8/1996 Saiki ............................ 341/155

(Continued)

FOREIGN PATENT DOCUMENTS

JP  2007-129549 A  5/2007
KR  1020010106167 A  11/2001

(Continued)

OTHER PUBLICATIONS

Kim et al., "A 5.4Gb/s Adaptive Equalizer Using Asynchronous-Sampling Histograms", ISSCC 2011, Session 20, High-Speed Transceivers & Building Blocks, 20.7, pp. 358-359.

(Continued)

*Primary Examiner* — Vineeta Panwalkar
(74) *Attorney, Agent, or Firm* — Carter, DeLuca, Farrell & Schmidt, LLP

(57) ABSTRACT

A duty cycle correcting device is provided which includes a pulse width adjusting unit which adjusts a pulse width of an input signal according to a pulse width control code; a comparison unit which compares an output signal of the pulse width control unit with a plurality of reference voltages; and a control unit which selects one of a plurality of pulse width control codes based on comparison data from the comparison unit and provides the selected pulse width control code to the pulse width adjusting unit.

17 Claims, 14 Drawing Sheets

(56) References Cited

U.S. PATENT DOCUMENTS

| | | | | |
|---|---|---|---|---|
| 5,757,218 | A * | 5/1998 | Blum | 327/175 |
| 7,884,651 | B2 * | 2/2011 | Diewald | 327/76 |
| 7,903,435 | B2 * | 3/2011 | Huang et al. | 363/21.13 |
| 2005/0083034 | A1 * | 4/2005 | De Cremoux | 324/140 R |
| 2007/0244656 | A1 * | 10/2007 | Cranford et al. | 702/79 |

FOREIGN PATENT DOCUMENTS

| | | |
|---|---|---|
| KR | 1020060102822 A | 9/2006 |
| KR | 100817071 B1 | 3/2008 |
| KR | 1020080098197 A | 11/2008 |
| KR | 1020110018638 A | 2/2011 |

OTHER PUBLICATIONS

Tae-Jin Hwang, et al., "A DLL-Based Multi-Clock Generator Having Fast-Relocking and Duty-Cycle Correction Scheme for Low Power and High Speed VLSIs" IEEK, vol. 42, No. SD2 11, pp. 23-29 (2005).

Jong-Chan Ha, et al., "A Multiphase DLL Based on a Mixed VCD/VCDL for Input Phase Noise Suppression and Duty-Cycle Correction of Multiple Frequencies", IEEK, vol. 47, No. SD 11, pp. 13-21 (2010).

The 19th Korean Conference on Semiconductors, "Semiconductor for Smart Living Technologies", Feb. 15, 2012.

Wang-Soo Kim, et al., "A 5.4Gb/s Adaptive Equalizer Using Asynchronous-Sampling Histograms", Yonsei University, Seoul, Korea, pp. 1-43, Sep. 2012.

Wang-Soo Kim, et al., "A 5.4-Gbit/s Adaptive Continuous-Time Linear Equalizer Using Asynchronous Undersampling Histograms", IEEE Transactions on Circuits and Systems-II: Express Briefs, vol. 59, No. 9, Sep. 2012, pp. 553-557.

Wang-Soo Kim, et al., "A 10-Gb/s low-power adaptive continuous-time linear equalizer using asynchronous under-sampling histogram", IEICE Electronics Express, vol. 10, No. 4, pp. 1-8 (published Feb. 18, 2013).

* cited by examiner

Fig. 9
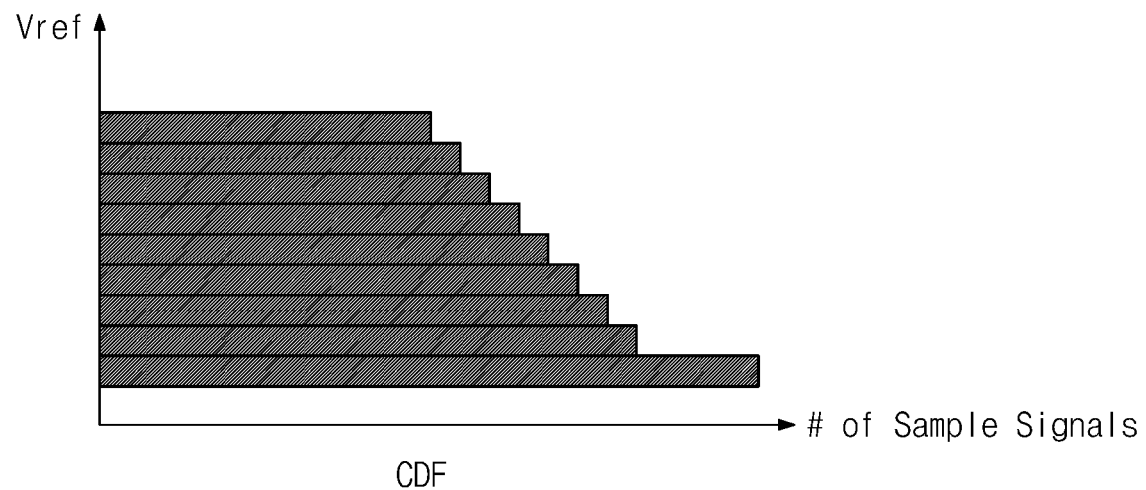
CDF
Differentiation
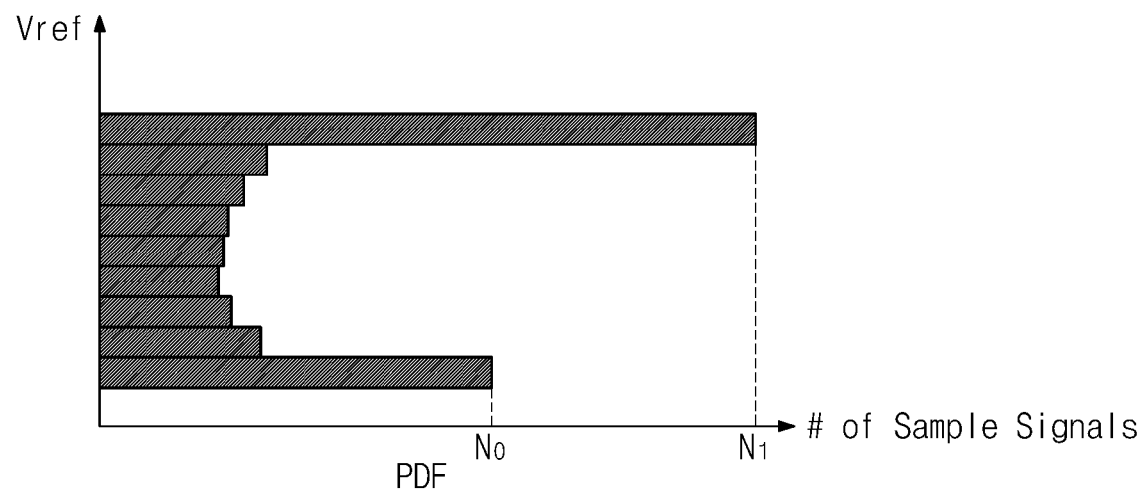
PDF

DEVICE AND METHOD FOR CORRECTING DUTY CYCLE, AND RECEIVER INCLUDING THE SAME

CROSS-REFERENCE TO RELATED APPLICATIONS

A claim for priority under 35 U.S.C. §119 is made to Korean Patent Application No. 10-2012-0148658 filed Dec. 18, 2012, in the Korean Intellectual Property Office, the entire contents of which are hereby incorporated by reference.

BACKGROUND

The inventive concepts described herein relate to a duty cycle correcting device, a duty cycle correcting method, and a receiver using the duty cycle correcting device and method.

Like a clock signal, a pulse signal having a plurality of pulses may have a predetermined duty cycle. The duty cycle may indicate a ratio of a pulse width to a pulse period, and a measure may be designated by "%".

A duty cycle corrector to correct a duty cycle may be applied to a delay locked loop (DLL) or a phase locked loop (PLL) such that a duty cycle of an output clock signal maintains a predetermined value (e.g., 50%).

The duty cycle corrector may store information on a duty error (e.g., indicating a level by which a duty cycle gets out of a desired duty cycle), and may correct the duty error of a clock signal using the stored information.

A conventional duty cycle corrector may correct only a duty of a clock signal where a pulse is repeated periodically. The conventional duty cycle corrector may not correct a duty cycle of a data signal for transferring data in a digital manner using a pulse. For this reason, a range of the conventional duty cycle corrector may be limited.

SUMMARY

One object of the inventive concept is to provide device and method capable of correcting a duty cycle of a clock signal having regularly iterated pulses and a duty cycle of a data signal having irregular pulses and a receiver including the apparatus and method.

Another object of the inventive concept is to provide a duty cycle correcting device, which operates using an asynchronous clock in a high-speed communications system, a duty cycle correcting method, and a receiver including the duty cycle correcting device and method.

One aspect of embodiments of the inventive concept is directed to provide a duty cycle correcting device which comprises a pulse width adjusting unit which adjusts a pulse width of an input signal according to a pulse width control code; a comparison unit which compares an output signal of the pulse width control unit with a plurality of reference voltages; and a control unit which selects one of a plurality of pulse width control codes based on comparison data from the comparison unit and provides the selected pulse width control code to the pulse width adjusting unit.

In example embodiments, the comparison unit compares a level of the output signal with a level of the reference voltage at a rising or falling transition time of a clock signal.

In example embodiments, the clock signal is an asynchronous signal the period of which is different from that of the input signal.

In example embodiments, the duty cycle correcting device further comprises a sampling unit which samples the output signal periodically, and wherein the comparison unit compares a sample signal from the sampling unit with the reference voltage.

In example embodiments, the duty cycle correcting device further comprises a reference voltage signal generator which receives a reference voltage control code from the control unit and generates a signal having a voltage set by the reference voltage control code.

In example embodiments, the control unit changes the reference voltage control code such that a voltage of a signal from the reference voltage signal generator is changed to control such that a plurality of reference voltages is sequentially provided to the comparison unit.

In example embodiments, the control unit changes a pulse width control code such that a pulse width of the output signal is changed to provide a plurality of pulse width control codes sequentially to the pulse width control unit.

In example embodiments, the control unit calculates a probability density function, associated with each of the pulse width control codes, on the event that a level of the output signal is higher than a level of the reference voltage, based on the comparison data, calculates a difference between the largest function value and the second-largest function value in the probability density function, and selects one, having the smallest difference, from among the pulse width control codes to output the selected pulse width control code to the pulse width adjusting unit.

In example embodiments, the control unit calculates a cumulative distribution function by counting the event that a level of the output signal is higher than a level of a reference voltage, with respect to each of the reference voltages and calculates the probability density function using the cumulative distribution function.

In example embodiments, the input signal is a data signal for transferring data using a pulse.

Another aspect of embodiments of the inventive concept is directed to provide a duty cycle correcting method which comprises adjusting a pulse width of an input signal according to a pulse width control code, through a pulse width adjusting unit; comparing an output signal of the pulse width control unit with a plurality of reference voltages, through a comparison unit; selecting one of a plurality of pulse width control codes based on comparison data from the comparison unit, through a control unit; and providing the selected pulse width control code to the pulse width adjusting unit through the control unit.

In example embodiments, the comparing comprises comparing a level of the output signal with a level of the reference voltage at a rising or falling transition time of a clock signal.

In example embodiments, the clock signal is an asynchronous signal the period of which is different from that of the input signal.

In example embodiments, the comparing comprises sampling the output signal periodically through a sampling unit; and comparing a sample signal from the sampling unit with the reference voltage through the comparison unit.

In example embodiments, the selecting comprises calculating a probability density function, associated with each of a pulse width control codes, on the event that a level of the output signal is higher than a level of the reference voltage, based on the comparison data through the control unit; calculating a difference between the largest function value and the second-largest function value in the probability density function through the control unit; and selecting one, having the smallest difference, from among the pulse width control codes through the control unit.

In example embodiments, the calculating a probability density function comprises calculating a cumulative distribution function by counting the event that a level of the output signal is higher than a level of a reference voltage, with respect to each of the reference voltages; and calculating the probability density function using the cumulative distribution function.

Still another aspect of embodiments of the inventive concept is directed to provide a duty cycle correcting method which acquires comparison data by comparing each of pulses signals, having different duty cycles, with a plurality of reference voltages and selects one of the plurality of pulse signals based on the comparison data, using a duty cycle correcting device.

Still another aspect of embodiments of the inventive concept is directed to provide a receiver which comprises an equalizer which equalizes an input signal; and a duty cycle corrector which corrects a duty cycle of the equalized signal. The duty cycle corrector comprises a pulse width adjusting unit which adjusts a pulse width of an input signal according to a pulse width control code; a comparison unit which compares an output signal of the pulse width control unit with a plurality of reference voltages; and a control unit which selects one of a plurality of pulse width control codes based on comparison data from the comparison unit.

In example embodiments, the control unit calculates a probability density function, associated with each of a pulse width control codes, on the event that a level of the output signal is higher than a level of the reference voltage, based on the comparison data through the control unit, calculates a difference between the largest function value and the second-largest function value in the probability density function through the control unit, and selects one, having the smallest difference, from among the pulse width control codes to output the selected pulse width control code to the pulse width adjusting unit.

In example embodiments, the control unit calculates a cumulative distribution function by counting the event that a level of the output signal is higher than a level of a reference voltage, with respect to each of the reference voltages and calculates the probability density function using the cumulative distribution function.

A duty cycle correcting method according to an embodiment of the inventive concept is stored at a computer-readable storage medium as a program to be executed by a computer.

With an embodiment of the inventive concept, it is possible to correct a duty cycle of a clock signal having regularly iterated pulses and a duty cycle of a data signal having irregular pulses to transfer data in a digital manner.

With an embodiment of the inventive concept, a duty cycle of a data signal may be maintained to have 50%. A jitter noise of a pulse stream may be reduced, and a bit error rate (BER) of a signal may be reduced.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 9 shows graphs of a cumulative distribution function calculated based on comparison data and a probability density function calculated based on the cumulative distribution function.

DETAILED DESCRIPTION

Figure 1:
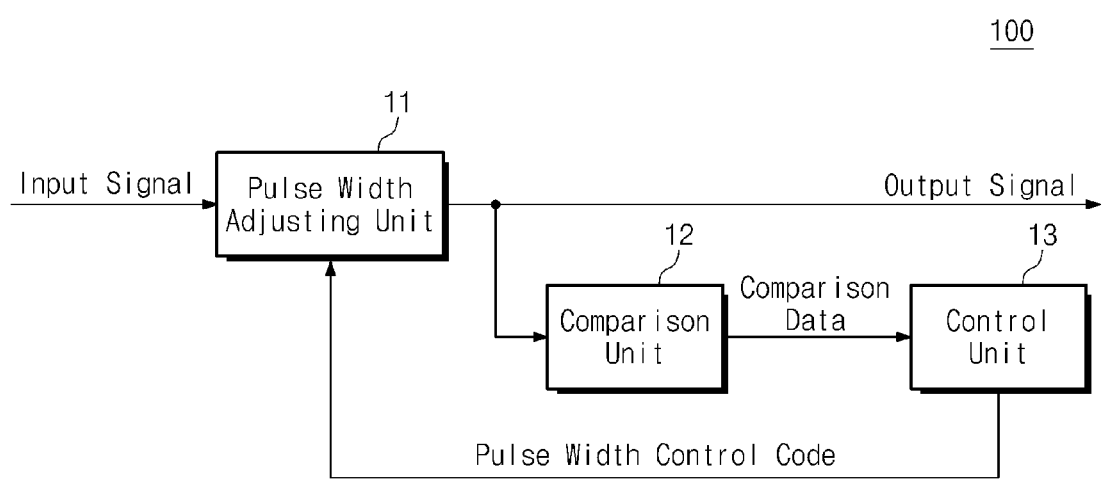
FIG. 1 is a block diagram schematically illustrating a duty cycle correcting device according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

With duty cycle correcting device and method of the inventive concept, comparison of plural reference voltages with plural pulse signals having different duty cycles may be executed, and an optimal pulse signal (e.g., a pulse signal having a duty cycle of 50%) may be selected from the plural pulse signals based on comparison data.

With duty cycle correcting device and method of the inventive concept, for example, a duty cycle of a pulse signal having the smallest difference may be decided to correspond to 50% by calculating a probability density function on the case that each of the plural pulse signals is larger than a reference voltage, based on the comparison data, and calculating a difference between the probability that an amplitude of a pulse signal corresponds to "1" and the probability that an amplitude of a pulse signal corresponds to "0", from the probability density function.

FIG. 1 is a block diagram schematically illustrating a duty cycle correcting device 100 according to an embodiment of the inventive concept. As illustrated in FIG. 1, a duty cycle correcting device 100 may include a pulse width adjusting unit 11, a comparison unit 12, and a control unit 13.

The pulse width adjusting unit 11 may adjust a pulse width of an input signal according to a pulse width control code. The comparison unit 12 may compare an output signal of the pulse width adjusting unit 11 with a plurality of reference voltages. The control unit 13 may select one of a plurality of pulse width control codes based on comparison data output from the comparison unit 12, and may provide the selected pulse width control code to the pulse width adjusting unit 11.

With an embodiment of the inventive concept, the pulse width adjusting unit 11 may receive a pulse signal having a plurality of pulses to adjust a pulse width of the input pulse signal.

Figure 2:
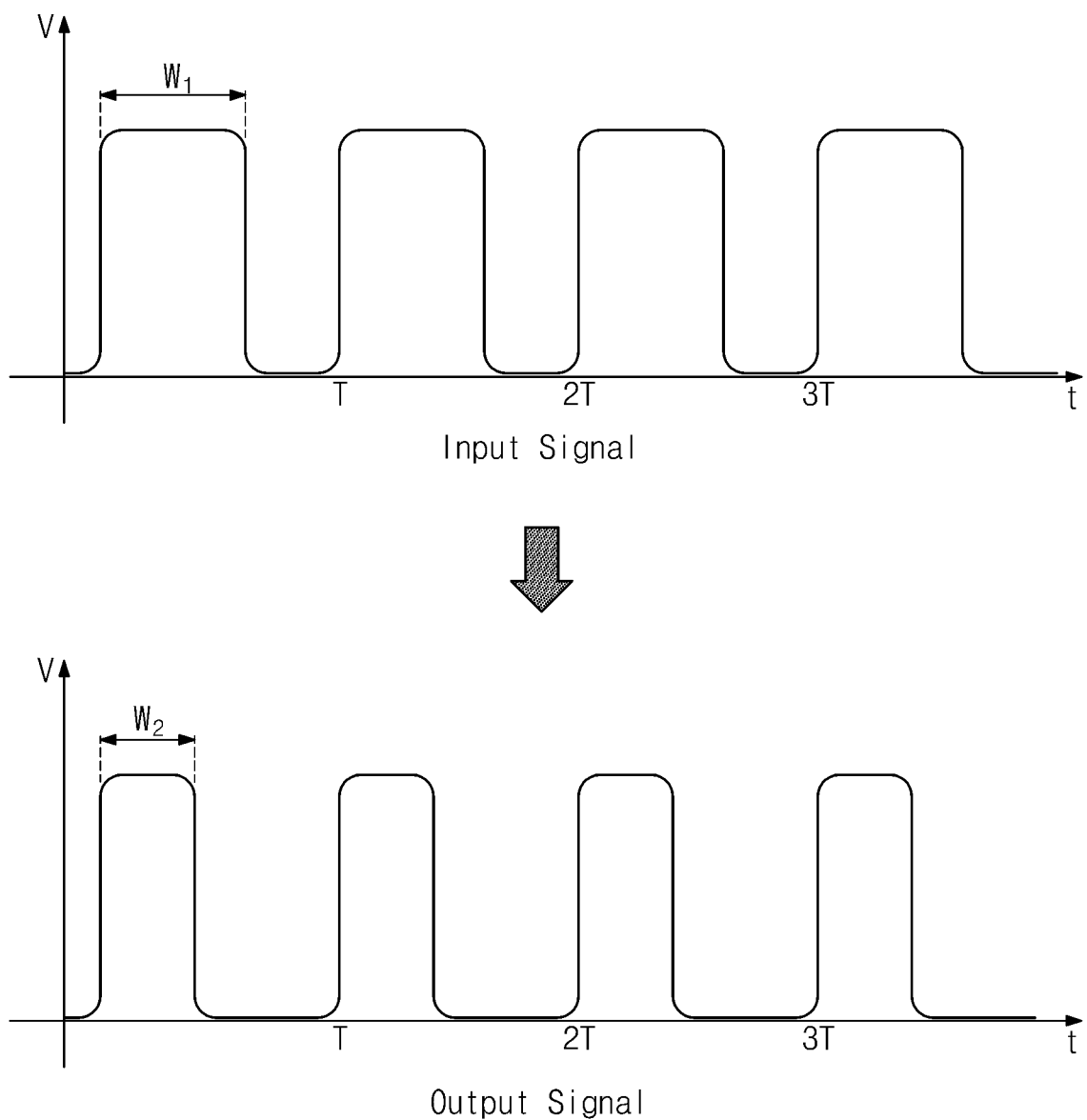
FIG. 2 is a diagram illustrating a pulse width adjusted by a pulse width adjusting unit according to an embodiment of the inventive concept.

FIG. 2 is a diagram illustrating a pulse width adjusted by a pulse width adjusting unit 11 according to an embodiment of the inventive concept.

As illustrated in FIG. 2, in the case that a pulse width of an input signal of a pulse width adjusting unit 11 is "$W_1$", a pulse width of the input signal may be adjusted to "$W_2$" through the pulse width adjusting unit 11. In other words, the pulse width adjusting unit 11 may change a duty cycle by adjusting a pulse width of the input signal.

In example embodiments, the input signal of the pulse width adjusting unit 11 may be a data signal for transferring data using pulses. In other example embodiments, the input signal of the pulse width adjusting unit 11 may be a clock signal having regularly iterated pulses.

The pulse width adjusting unit 11 may adjust a pulse width of the input signal according to a pulse width control code. In example embodiments, the pulse width control code may be provided from a control unit 13.

In example embodiments, the control unit 13 may change the pulse width control code such that a pulse width of an output signal of the pulse width adjusting unit 11 is changed, and may provide the pulse width control code to the pulse width adjusting unit 11. In example embodiments, the control unit 13 may sequentially provide a plurality of pulse width control codes to the pulse width adjusting unit 11 by changing the pulse width control code.

A comparison unit 12 may output comparison data by comparing the output signal of the pulse width adjusting unit 11 with a plurality of reference voltages. In example embodiments, the comparison unit 12 may compare a level of an output signal with a level of a reference voltage using a clock signal.

Figure 3:
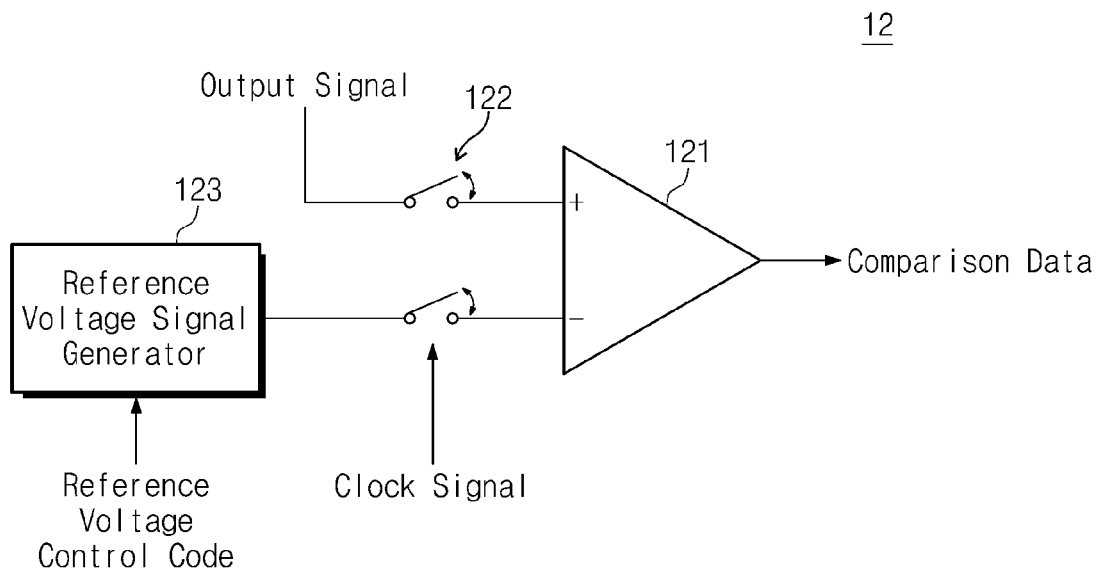
FIG. 3 is a block diagram schematically illustrating a comparison unit according to an embodiment of the inventive concept.

FIG. 3 is a block diagram schematically illustrating a comparison unit 12 according to an embodiment of the inventive concept.

Referring to FIG. 3, a comparison unit 12 may receive an output signal of a pulse width adjusting unit 11, and may perform comparison between the output signal and a reference voltage in plurality using a clock signal.

In example embodiments, the comparison unit 12 may compare a level of the output signal with a level of the reference voltage at a rising or falling transition time of the clock signal.

For example, as illustrated in FIG. 3, the comparison unit 12 may include a comparator 121 which compares signals of a non-inverting input terminal (+) and an inverting input terminal (−) to output a "1" or "0" signal. An output signal may be applied to the non-inverting input terminal of the comparator 121, and a reference voltage signal may be applied to the inverting input terminal of the comparator 121. The output signal may be applied to the non-inverting input terminal of the comparator 121 through a switch selectively closed by the clock signal, and the reference voltage signal may be applied to the inverting input terminal of the comparator 121 through a switch selectively closed by the clock signal.

In example embodiments, the clock signal may be an asynchronous signal the period of which is different from that of the input signal. However, the inventive concept is not limited thereto. For example, the clock signal may be a synchronous signal synchronized with the input signal.

In example embodiments, a period of the clock signal may be longer than that of the input signal. However, the inventive concept is not limited thereto. For example, a period of the clock signal may be shorter than that of the input signal.

The output signal and the reference voltage signal may be compared at a rising transition time or a falling transition time of the clock signal using the comparison unit 12 of FIG. 3. The comparator 121 may output "1" when a level of the output signal is higher than a level of the reference voltage and "0" when a level of the output signal is lower than a level of the reference voltage.

In accordance with an embodiment of the inventive concept, as illustrated in FIG. 3, a duty cycle correcting device 100 may further comprises a reference voltage signal generator 123 which generates a reference voltage signal according to a reference voltage control code. In example embodiments, the reference voltage control code may be provided from a control unit 13.

In example embodiments, the control unit 13 may change the reference voltage control code such that a level of an output signal of the reference voltage signal generator 123 is changed, and may provide the reference voltage control code to the reference voltage signal generator 123. In example embodiments, the control unit 13 may sequentially provide a plurality of reference voltages by changing the reference voltage control code.

In other example embodiments, the duty cycle correcting device 100 may further comprise a sampling unit to sample an output signal.

Figure 4:
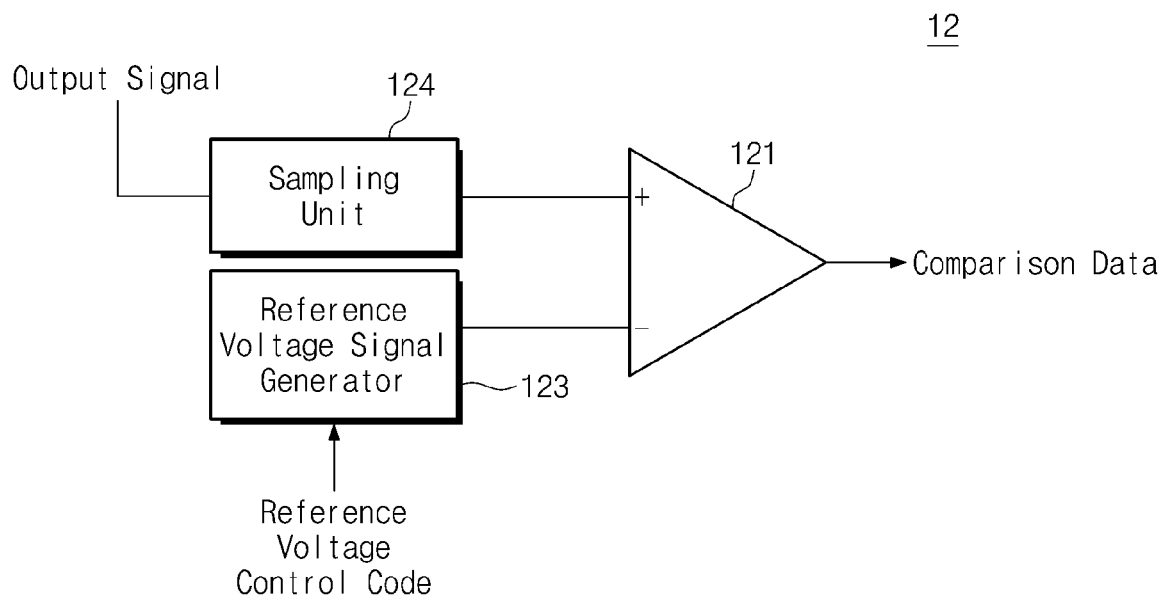
FIG. 4 is a block diagram schematically illustrating a comparison unit according to another embodiment of the inventive concept.

FIG. 4 is a block diagram schematically illustrating a comparison unit 12 according to another embodiment of the inventive concept. As illustrated in FIG. 4, a duty cycle correcting device 100 may further comprise a sampling unit 124 for sampling an output signal to provide a plurality of sample signals to a comparator 121. In example embodiments, the sampling unit 124 may sample the output signal periodically or non-periodically to output a plurality of sample signals.

The comparator 121 may compare a sample signal from the sampling unit 124 and a reference voltage signal from a reference voltage signal generator 123 to output comparison data. In example embodiments, the comparator 121 may output a signal corresponding to "1" when a level of a sample signal applied to a non-inverting input terminal is higher than that of a reference voltage signal applied to an inverting input terminal and a signal corresponding to "0" when a level of a sample signal applied to the non-inverting input terminal is lower than that of a reference voltage signal applied to the inverting input terminal.

As will be described later, in the case that an optimal pulse width control code is selected by calculating a probability distribution on the case that a level of a sample signal is higher than that of a reference voltage, a duty cycle correcting device 100 according to an embodiment of the inventive concept may calculate the probability distribution more exactly in proportion to an increase in the number of sample signals sampled from an output signal. However, in the event that the duty cycle correcting device 100 is integrated to a chip, it is difficult to increase the number of sample signals excessively.

Thus, there is required a technique for deciding the number of sample signals suitable to satisfy both complexity and reliability of a system.

In accordance with an embodiment of the inventive concept, the sampling unit 124 may output sample signals the number of which is calculated using the probability that a sampling value of a pulse signal is "1".

For example, a sampling process of the sampling unit 124 may be modeled by a transposition process. At this time, the case that a sampled signal is "1" may be assumed to be successful and the case that a sampled signal is "0" may be assumed to be failed.

A state of a signal from which inter symbol interference (ISI) is removed may designate all cases in a 3-bit pattern. For example, if a signal of "111" is sampled, a sample signal may always have a value of "1". If a signal of "110" or "011" is sampled, a sample signal may have a value of "1" with the probability of 0.5.

Thus, the probability "p" that a sampling value of an ISI-free pulse signal is "1" may be calculated as follows with respect to eight cases.

$$p = \frac{(1 + 2 \times 0.5)}{8} = 0.25 \quad (1)$$

Herein, in the event that a transposition process satisfies a condition of np⟩10 with respect to a sample number "n" and the probability "n", the transposition process may be approximated to a normal distribution. The sample number "n" having a confidence interval of (1-α) and an allowable error "e" with respect to a sample group having the normal distribution may be calculated as follows.

$$n \geq \frac{p(1-p)\left(z_{\frac{(1-\alpha)}{2}}\right)^2}{e^2} \quad (2)$$

Herein, z(1-α)/2 may indicate a threshold value where both ends of the normal distribution becomes an interval of α/2. In other words, "α" may be 0.01 with respect to the confidence interval of 99%. At this time, z(1-α)/2 may be 2.58.

Also, if an allowable error and a confidence interval are decided to be 1.75% and 99% respectively in the above equation in view of the stability of system, the sample number "n" may be 4075.

Thus, the number of sample signals obtained by sampling an output signal through the sampling unit 124 may be set to 4096 ($2^{12}$) more than 4075. However, in the case that the allowable error and the confidence interval are changed, the number of sample signals may be more or less than 4096.

The control unit 13 may select one of a plurality of pulse width control codes to be provided to the pulse width adjusting unit 11 based on comparison data from the comparison unit 12.

In accordance with an embodiment of the inventive concept, comparison of plural reference voltages with plural output signals having different duty cycles may be executed, a probability density function on the case that each of the plural output signals is larger than a reference voltage may be calculated based on the comparison data, and one of the plural output signals may be selected using the probability density function.

FIGS. 5 to 8 are diagrams for describing a process in which a probability density function is calculated through comparison of an output signal of a pulse width adjusting unit 11 with plural reference voltages.

Figure 5:
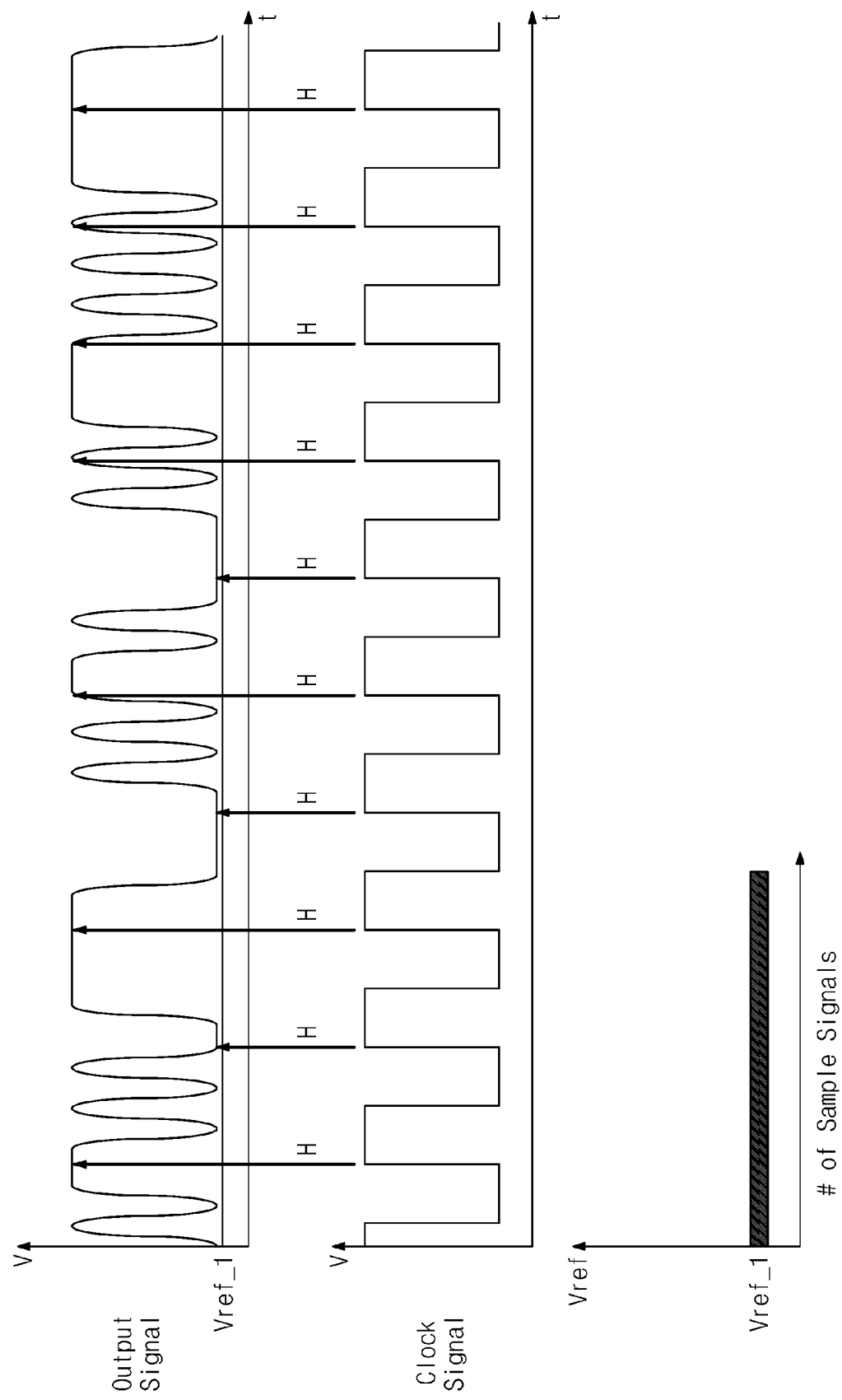
FIGS. 5 to 8 are diagrams for describing a process in which a probability density function is calculated through comparison of an output signal of a pulse width adjusting unit with plural reference voltages.

As illustrated in FIG. 5, a comparison unit 12 may compare a level of an output signal and a level of a reference voltage at a rising transition time of a clock signal. The comparison unit 12 may output a signal corresponding to "1" when a level of the output signal is higher than a level of the reference voltage and a signal corresponding to "0" when a level of the output signal is lower than a level of the reference voltage. In FIG. 5, since a reference voltage Vref_1 is set to be lower than a voltage corresponding to an output signal of "0", all sample signals sampled from the output signal may have a voltage higher than the reference voltage Vref_1.

A control unit 13 may count the event that a level of the output signal is higher than a level of the reference voltage, based on comparison data output from the comparison unit 12. In a bar graph of FIG. 5, a horizontal axis may indicate the number of sample signals having a voltage higher than a reference voltage and a vertical axis may indicate a level of a reference voltage.

The control unit 13 may change a reference voltage control code to adjust a level of a reference voltage provided to a comparator 121 from a reference voltage signal generator 123. In example embodiments, a level of a reference voltage provided to the comparator 121 may sequentially increase.

Figure 6:
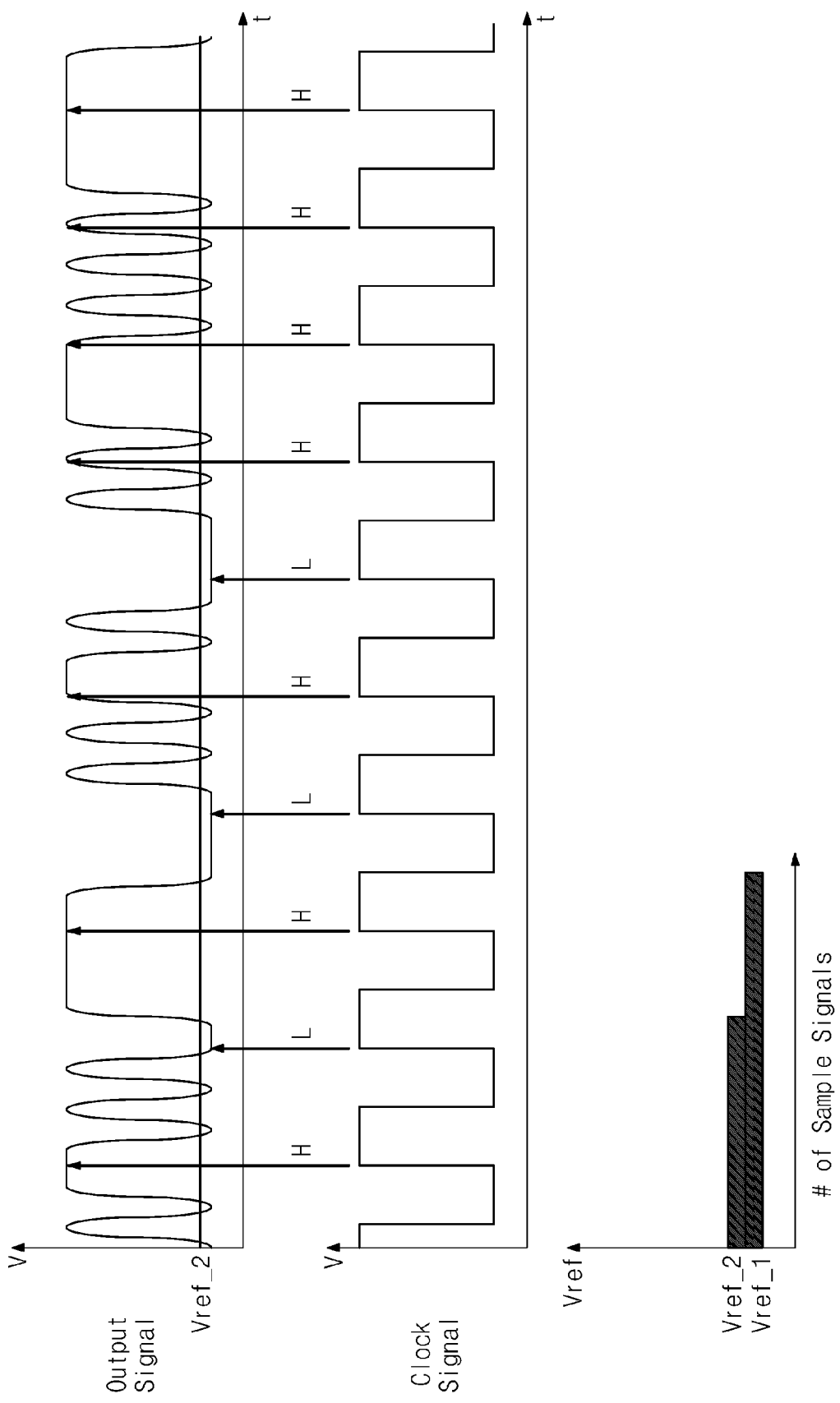
Figure 7:
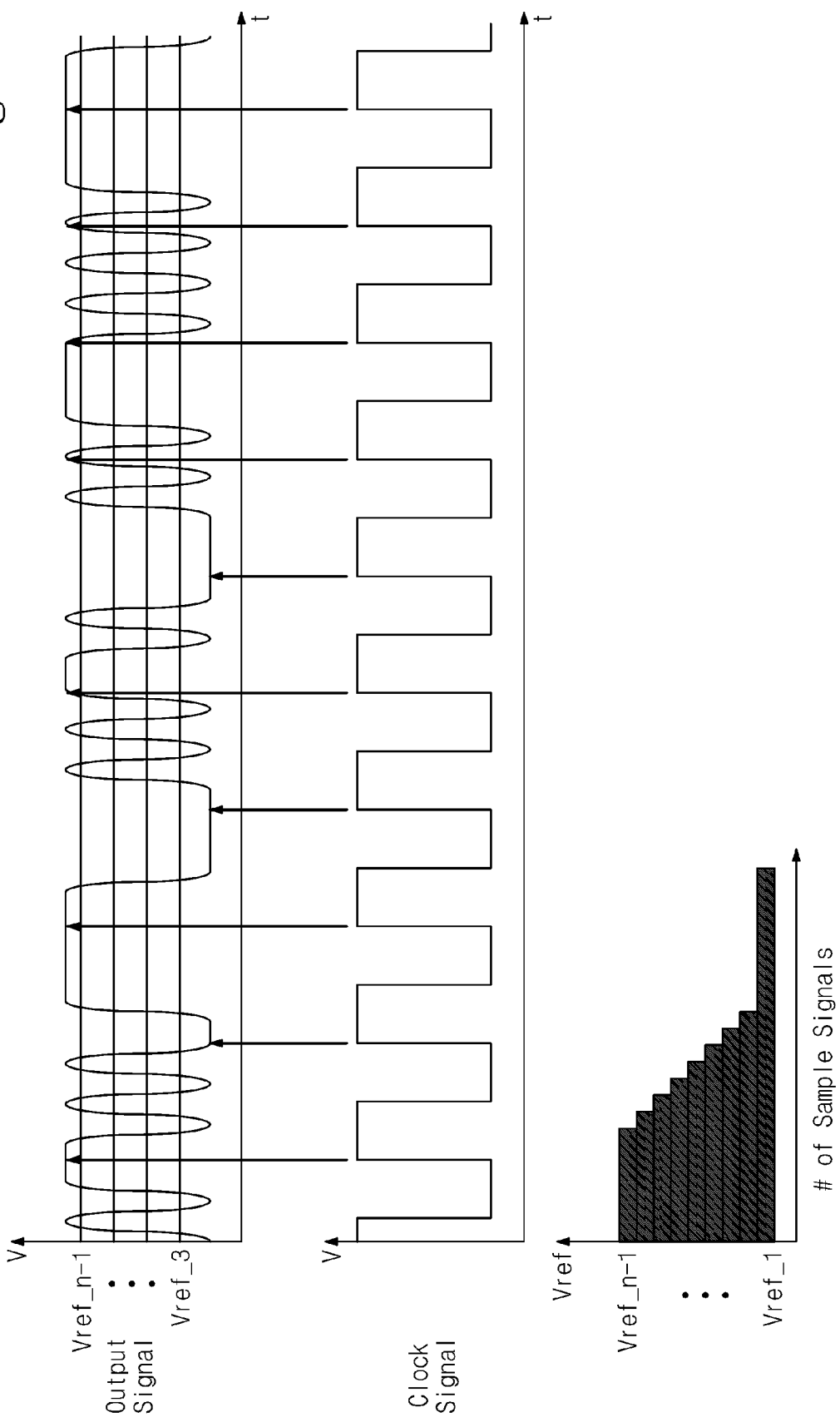

In this case, as illustrated in FIG. 6, a reference voltage Vref_2 may be higher than the reference voltage Vref_1. The comparison unit 12 may repeat an operation of outputting comparison data through comparison between a level of the output signal and a level of the reference voltage executed at a rising transition time of the clock signal.

Unlike FIG. 5, since the reference voltage Vref_2 is set to be higher than a voltage corresponding to an output signal of "0", as illustrated in FIG. 6, a part of sample signals sampled from the output signal may have a voltage lower than the reference voltage Vref_2.

The control unit 13 may count the event that a level of the output signal is higher than a level of the reference voltage Vref_2, based on comparison data output from the comparison unit 12. A graph of FIG. 6 may show a bar indicating the number of sample signals each having a voltage higher than the reference voltage Vref_2, according to a counting result. As understood from the bar graph of FIG. 6, as a reference voltage increases, the number of sample signals each having a voltage higher than the reference voltage may decrease.

As described above, the control unit 13 may increase a level of a reference voltage applied to the comparison unit 12 by changing a reference voltage control code. At a top of FIG. 7, reference voltages Vref_3 to Vref_n−1 gradually increasing may be illustrated. At a bottom of FIG. 7, there may be illustrated a bar graph indicating the number of sample signals each having a voltage higher than a reference voltage based on comparison data obtained through comparison between the reference voltage and the output signal.

Figure 8:
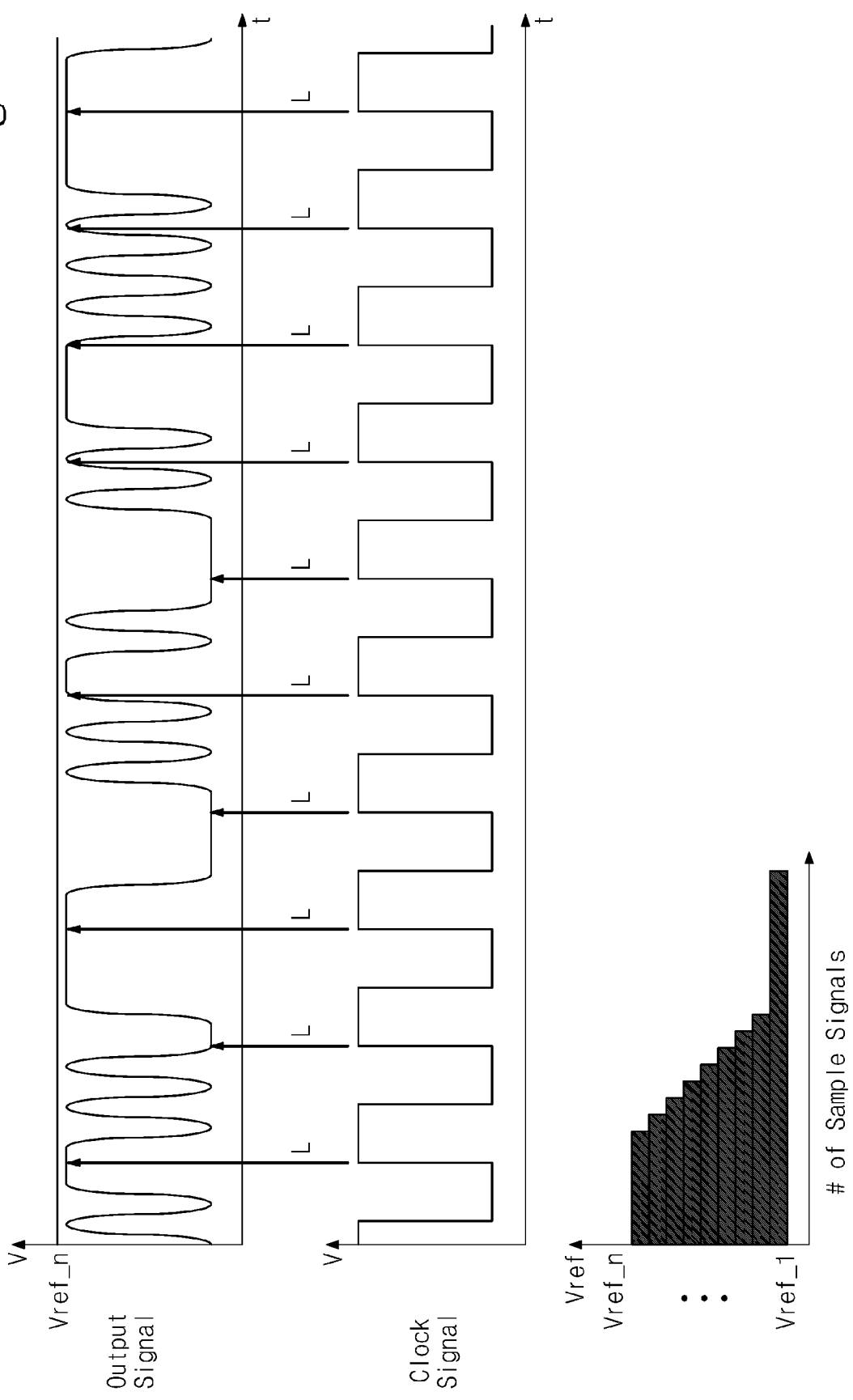

Finally, as illustrated in FIG. 8, the comparison unit 12 may compare the output signal with a reference voltage Vref_n higher than a voltage corresponding to the output signal of "1". In this case, all sample signals sampled from the output signal may have a voltage lower than the reference voltage Vref_n. As a result, as illustrated in FIG. 8, a sample signal having a voltage higher than the reference voltage Vref_n may not exist.

In accordance with an embodiment of the inventive concept, the control unit may calculate a cumulative distribution function (CDF) based on a result obtained by counting the event that a level of the output signal is higher than a level of each of reference voltages. The control unit 13 may calculate a probability density function (PDF) using the cumulative distribution function.

FIG. 9 shows graphs of a cumulative distribution function (CDF) calculated based on comparison data and a probability density function (PDF) calculated based on the cumulative distribution function.

A control unit 13 may calculate a cumulative distribution function (CDF) corresponding to an upper graph of FIG. 9, based on a result of counting the number of sample signals each having a voltage higher than each of plural reference voltages. The control unit 13 may calculate a probability density function (PDF) corresponding to a lower graph of FIG. 9 from the cumulative distribution function (CDF). In example embodiments, the control unit 13 may obtain a probability density function f(x) with respect to the cumulative distribution function F(x) using the following equation.

$$f(x) = \frac{d}{dx}F(x) \tag{3}$$

In case of an embodiment of FIG. 9, the probability density function (PDF) may be obtained by calculating a difference between sample signal numbers with respect to reference voltages Vref constituting the cumulative distribution function (CDF).

In the event that an input signal provided to a duty cycle correcting device 100 according to an embodiment of the inventive concept is formed of a plurality of pulses each having "0" or "1", as illustrated in FIG. 9, the probability density function (PDF) may indicate that the number N0 of sample signals to a reference voltage Vref_1 indicating the number of sample signals corresponding to "0" and the number N1 of sample signals to a reference voltage Vref_n indicating the number of sample signals corresponding to "1" are large.

On the other hand, in FIG. 9, sample signals to reference voltages Vref_2 to Vref_n−1 may exist. The reason may be that an input signal has a voltage corresponding to an intermediate level between "1" and "0" due to a noise.

In accordance with an embodiment of the inventive concept, the control unit 13 may change a pulse width control code provided to a pulse width adjusting unit 11 to calculate the probability density function (PDF) on each of plural pulse width control codes based on comparison data. The control unit 13 may calculate a difference between the largest function value and a second-largest function value in the probability density function (PDF).

For example, in the probability density function (PDF) illustrated in FIG. 9, the control unit 13 may calculate a difference ΔN (N1−N0) between the largest function value N1 and a second-largest function value N0.

Figure 10:
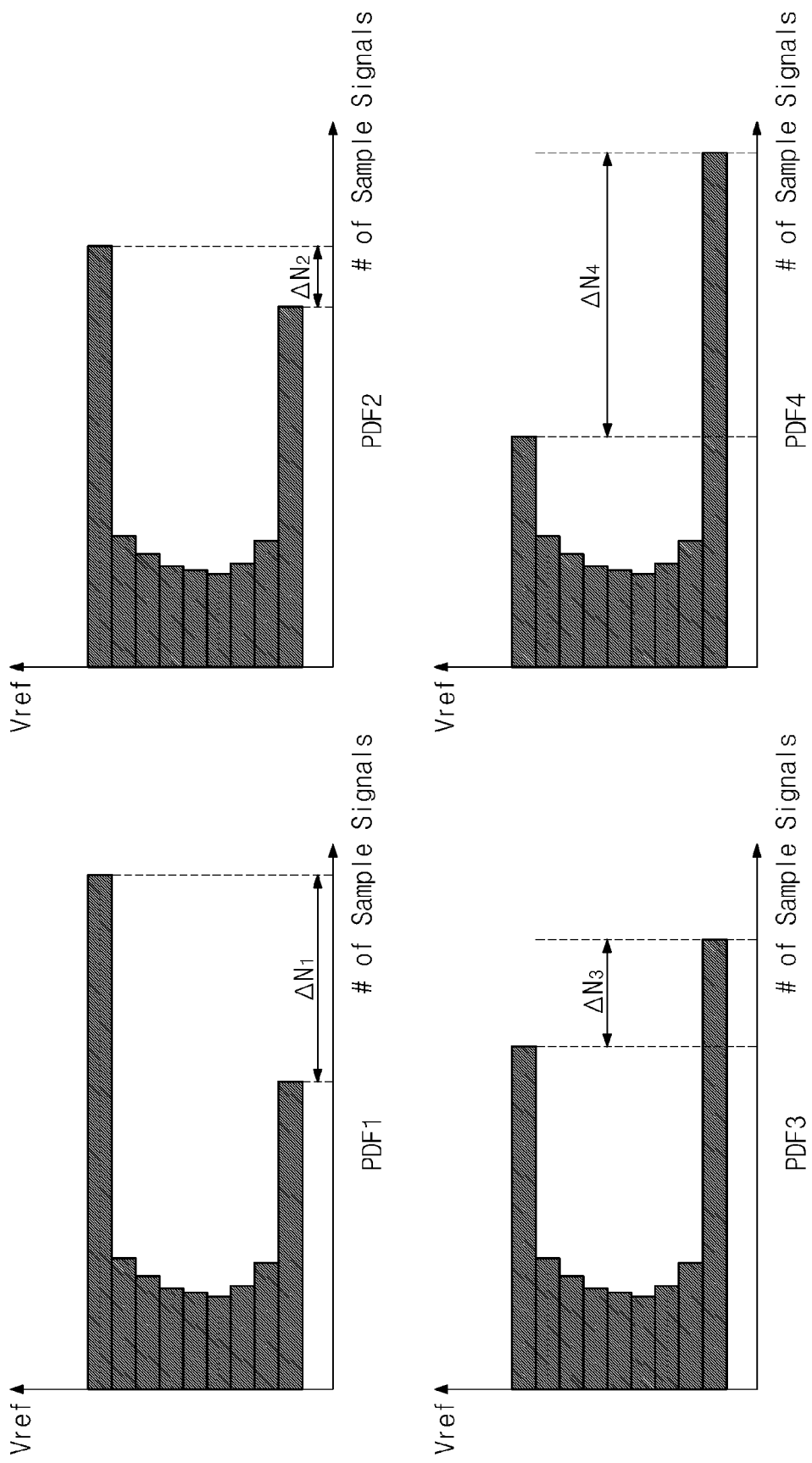
FIG. 10 shows graphs of probability density functions calculated with respect to plural pulse width control codes and differences between function values calculated.

FIG. 10 shows graphs of probability density functions calculated with respect to plural pulse width control codes and differences ΔN between function values calculated.

As illustrated in FIG. 10, if four pulse width control codes are provided to a pulse width adjusting unit 11, a control unit 13 may calculate probability density functions PDF1 to PFD4 with respect to the pulse width control codes based on comparison data. The control unit 13 may calculate a difference ΔNi (i being 1 to 4) between the largest function value and a second-largest function value with respect to each of the probability density functions PDF1 to PFD4.

The control unit 13 may compare the calculated differences ΔN1 to ΔN4 to select one, having the smallest difference, from among the pulse width control codes. In an embodiment of FIG. 10, a probability density function having the smallest difference may be a probability density function PDF2. Thus, the control unit 13 may select a pulse width control code corresponding to the probability density function PDF2 to output the selected pulse width control code to the pulse width adjusting unit 11.

As described above, in a probability density function, the number N0 of sample signals corresponding to a reference voltage Vref_1 may be a portion corresponding to a pulse signal of "0", and the number N1 of sample signals corresponding to a reference voltage Vref_n may be a portion corresponding to a pulse signal of "1". A duty cycle of an input signal may be corrected in view of such a point that a duty cycle of a pulse signal approaches 50% as a difference ΔN between the number N0 of sample signals corresponding to the reference voltage Vref_1 and the number N1 of sample signals corresponding to the reference voltage Vref_n approaches "0".

Figure 11:
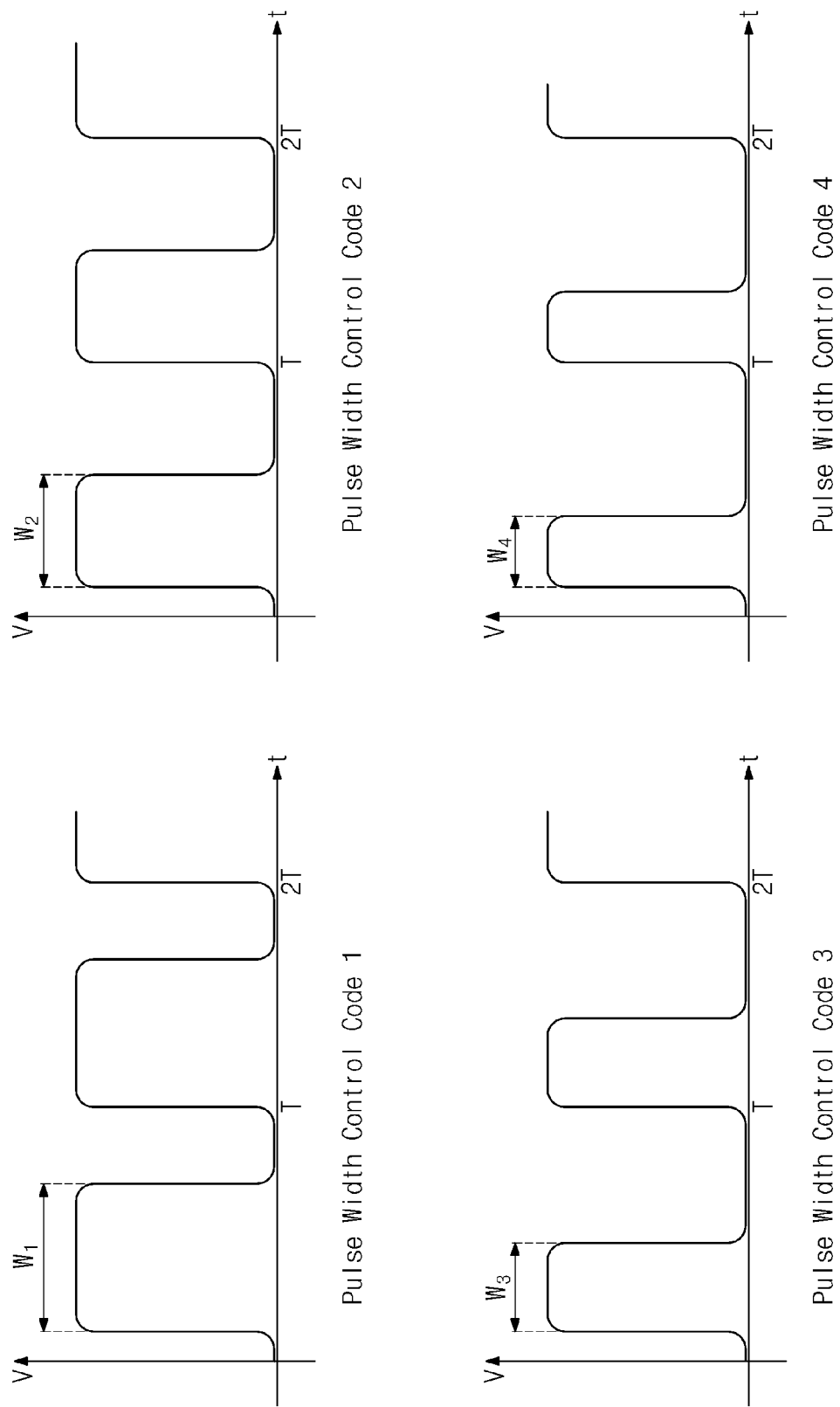
FIG. 11 shows output signals according to pulse width control codes corresponding to graphs of probability density functions of FIG. 10.

FIG. 11 shows output signals according to pulse width control codes corresponding to graphs of probability density functions of FIG. 10.

As illustrated in FIG. 11, as a difference ΔN between the largest function value and a second-largest function value in a probability density function PFD on a pulse signal becomes smaller, a duty cycle of the pulse signal may approach 50%. A duty cycle of a pulse signal corresponding to a probability density function PFD2, having the smallest difference N, of probability density functions of FIG. 10 may be closest to 50%. Thus, a control unit 13 may select a pulse width control code 2 of pulse width control codes 1 to 4 using the probability density function, and may provide the selected control code to a pulse width adjusting unit 11.

The pulse width adjusting unit 11 may adjust a pulse width of an input signal in response to the selected pulse width control code such that a duty cycle of the input signal is corrected to have about 50%.

Figure 12:
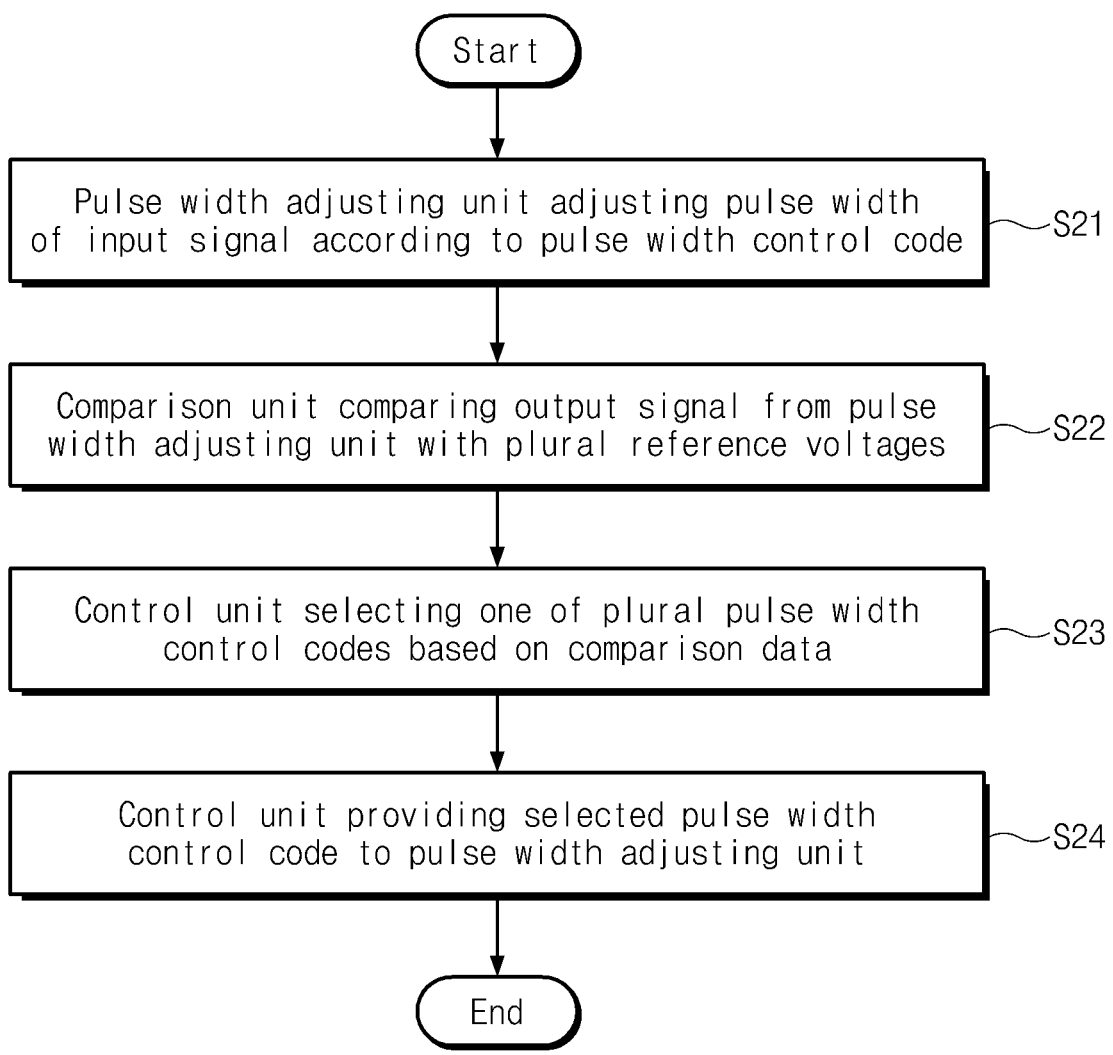
FIG. 12 is a flow chart illustrating a duty cycle correcting method according to an embodiment of the inventive concept.

FIG. 12 is a flow chart illustrating a duty cycle correcting method according to an embodiment of the inventive concept. A duty cycle correcting method according to an embodiment of the inventive concept may be executed using a duty cycle correcting device 100 according to an embodiment of the inventive concept. The duty cycle correcting method may acquire comparison data by comparing each of plural pulse signals with a plurality of reference voltages and outputting one of the plurality of pulse signals based on the comparison data.

As illustrated in FIG. 12, the duty cycle correcting method 200 may include adjusting a pulse width of an input signal according to a pulse width control code through a pulse width adjusting unit 11 (S21); comparing an output signal of the pulse width adjusting unit 11 with a plurality of reference voltages through a comparison unit 12 (S22); selecting one of a plurality of pulse width control codes according to comparison data of the comparison unit 12 through a control unit 13 (S23); and providing the selected pulse width control code to the pulse width adjusting unit 11 from the control unit 13.

In example embodiments, to obtain comparison data with respect to each of the plurality of pulse signals, the duty cycle correcting method 200 may include adjusting a pulse width of an input signal according to a pulse width control code through the pulse width adjusting unit 11; comparing an output signal of the pulse width adjusting unit 11 with a plurality of reference voltages through the comparison unit 12; and changing a pulse width control code to be provided to the pulse width adjusting unit 122 through the control unit 13.

In other words, to acquire comparison data obtained by comparing a reference voltage with each of a plurality of pulse signals, there may be iterated operations of sequentially changing a pulse width control code provided to the pulse width adjusting unit 11 through the control unit 13, adjusting a pulse width of an input signal according to the changed pulse width control code through the pulse width adjusting unit 11, and comparing an output signal and a reference voltage through the comparison unit 12.

In example embodiments, the comparing may include comparing a level of an output signal with a level of a reference voltage at a rising or falling transition time of a clock signal applied to the comparison unit 12.

In example embodiments, the clock signal may be an asynchronous signal having a period different from the input signal. For example, the clock signal may be an asynchronous signal the period of which is longer than that of an input signal. In other example embodiments, the clock signal is a synchronous signal synchronized with the input signal.

In other example embodiments, the comparing may include sampling an output signal through a sampling unit 124; and comparing a sample signal from the sampling unit 124 with a reference voltage through the comparison unit 12. The sampling unit 124 may sample the output signal periodically or non-periodically to output a plurality of sample signals.

In accordance with an embodiment of the inventive concept, the duty cycle correcting method 200 may calculate a probability density function with respect to each of a plurality of pulse width control code; and selecting one of the plurality of pulse width control codes using the probability density function calculated.

For example, to select one of the plurality of pulse signals based on the comparison data, the duty cycle correcting method 200 may include calculating a probability density function (PDF) on the event that a level of an output signal is higher than a level of a reference voltage, based on comparison data through the control unit 13 with respect to each of the plurality of pulse width control codes; calculating a difference ΔN between the largest function value and the second-largest function value in the probability density function (PDF) through the control unit 13; and selecting one, having the smallest difference ΔN, from among the plurality of pulse width control codes through the control unit 13.

In accordance with an embodiment of the inventive concept, the calculating a probability density function (PDF) may include calculating a cumulative distribution function (CDF) by counting the event that a level of an output signal is higher than a level of a reference voltage, with respect to the plurality of reference voltages; and calculating the probability density function (PDF) using the cumulative distribution function (CDF).

Figure 13:
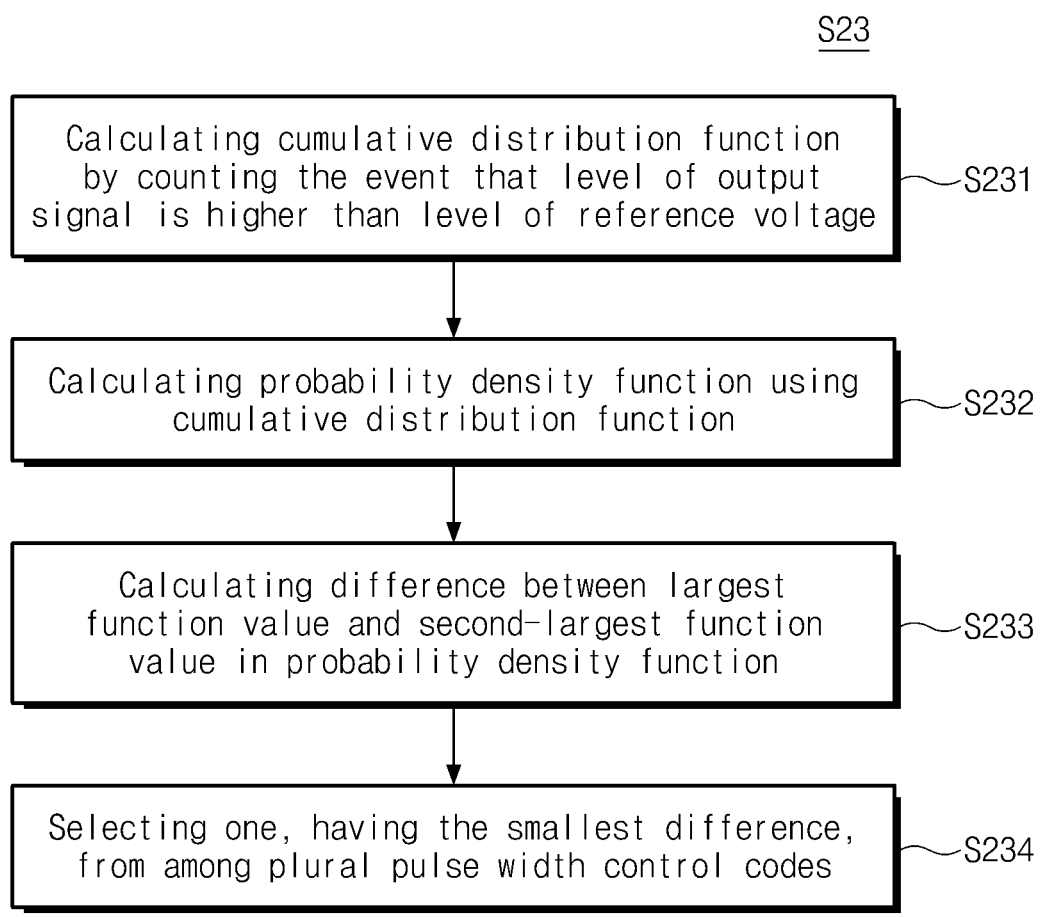
FIG. 13 is a flow chart for describing an operation of selecting one of a plurality of pulse width control code according to an embodiment of the inventive concept.

FIG. 13 is a flow chart for describing an operation of selecting one of a plurality of pulse width control code according to an embodiment of the inventive concept.

As illustrated in FIG. 13, such an operation that a control unit 13 may select one of a plurality of pulse width control codes based on comparison data (S23) may include operations of calculating a cumulative distribution function (CDF) by counting the event that a level of an output signal is higher than a level of a reference voltage (S231); calculating a probability density function (PDF) using the cumulative distribution function (CDF) (S232); calculating a difference ΔN between the largest function value and the second-largest function value in the probability density function (PDF)

(S233); and selecting one, having the smallest difference ΔN, from among the plurality of pulse width control codes (S234).

Then, the control unit 13 may transfer the selected pulse width control code to a pulse width adjusting unit 11, and the pulse width adjusting unit 11 may adjust a pulse width of an input signal according to the selected pulse width control code. Finally, an output signal of the pulse width adjusting unit 11 may have a duty cycle corresponding to 50% or a duty cycle corresponding to approximately 50%.

Figure 14:
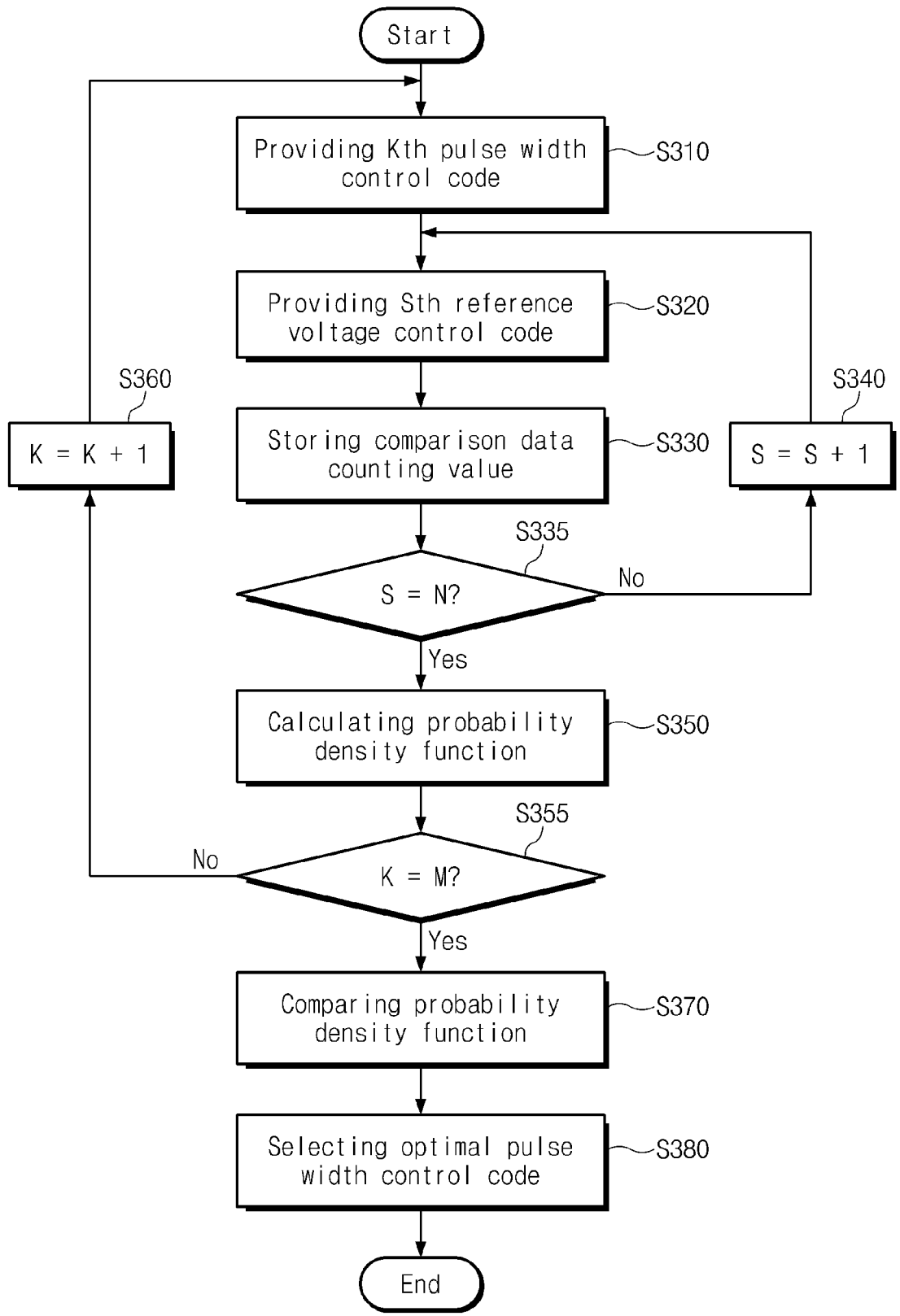
FIG. 14 is a flow chart illustrating a duty cycle correcting method according to another embodiment of the inventive concept.

FIG. 14 is a flow chart illustrating a duty cycle correcting method 300 according to another embodiment of the inventive concept.

As illustrated in FIG. 14, a duty cycle correcting method 300 according to another embodiment of the inventive concept may include providing a Kth pulse width control code to a pulse width adjusting unit 11 through a control unit 13 (S310); providing an Sth reference voltage control code to a reference voltage signal generator through the control unit 13 (S320); storing a counting value of comparison data obtained by comparing a sample signal of a pulse signal with a reference voltage through the control unit 13 (S330); increasing "S" by 1 until "S" reaches "N" to iterate operations S320 and S330 (S335); calculating a probability density function on the Kth pulse width control code (S350); increasing "K" by 1 until "K" reaches "M" to iterate operations S310 to S350 (S355); comparing probability density functions on M pulse width control codes (S370); and selecting an optimal pulse width control code from the M pulse width control codes (S380).

In example embodiments, the operation S350 may include calculating a cumulative distribution function using a counting value; and calculating a probability density function from the cumulative distribution function.

In example embodiments, the operation S370 may include calculating a difference between the largest function value and the second-largest function value in the probability density function with respect to each pulse width control code.

In example embodiments, the operation S380 may include selecting a pulse width control code having the smallest difference between the largest function value and the second-largest function value in the probability density function.

The above-described duty cycle correcting method 200/300 may be stored at a computer-readable storage medium as a type of program capable of being executed at a computer. The computer-readable storage medium may include all sorts of storage devices where data read by a computer system is read. For example, the computer-readable storage medium may include a ROM, a RAM, a CD-ROM, a magnetic tape, a floppy disk, an optical data storage device, and so on.

Figure 15:
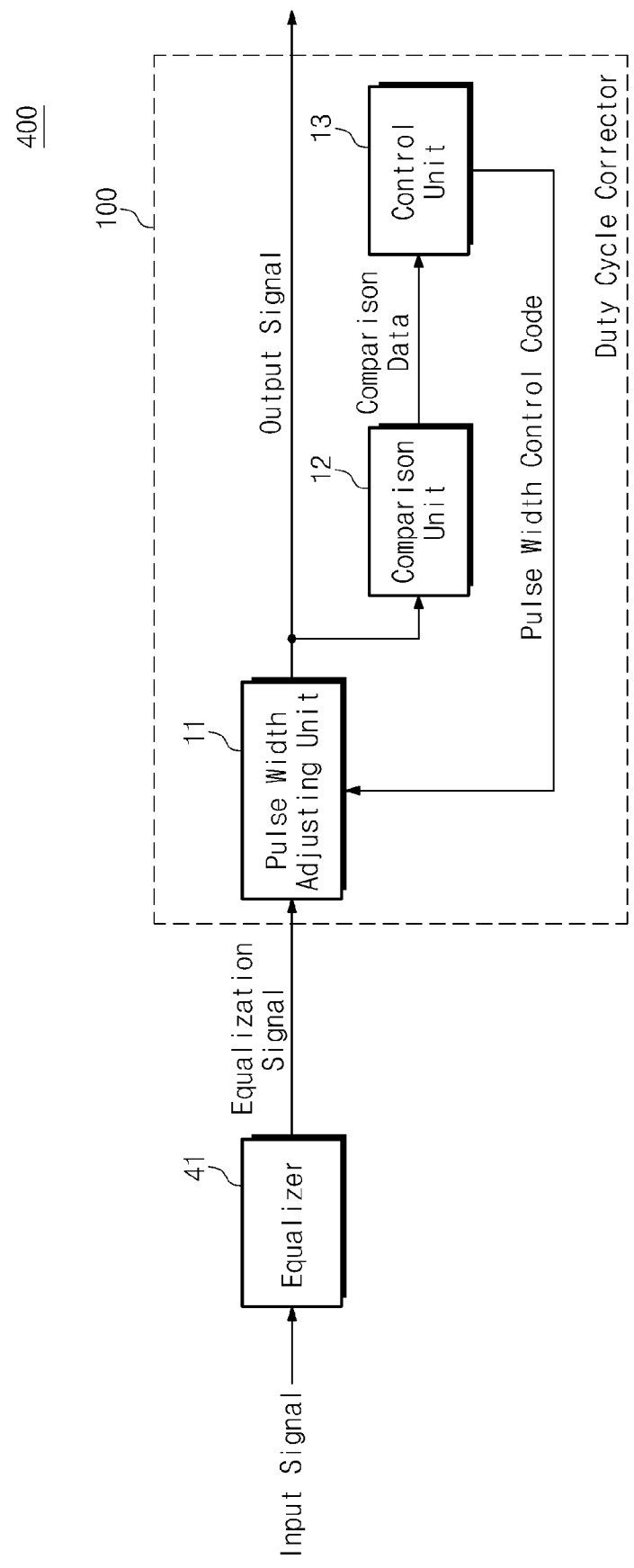
FIG. 15 is a block diagram schematically illustrating a duty cycle corrector according to an embodiment of the inventive concept.

FIG. 15 is a block diagram schematically illustrating a duty cycle corrector according to an embodiment of the inventive concept.

As illustrated in FIG. 15, a receiver 400 according to an embodiment of the inventive concept may include an equalizer 41 for equalizing an input signal and a duty cycle corrector 100 for correcting a duty cycle of the equalized signal.

The equalizer 41 may equalize a signal for compensation of distortion caused when a signal is amplified or transferred. For example, the equalizer 41 may amplify a high frequency component of the input signal to remove ISI generated when a pulse of the input signal is distributed by a communications channel.

The duty cycle corrector 100 may correspond to a duty cycle correcting device 100 according to an embodiment of the inventive concept. For example, the duty cycle corrector 100 may include a pulse width adjusting unit 11 to adjust a pulse width of an input signal according to a pulse width control code; a comparison unit 12 to compare an output signal of the pulse width adjusting unit 11 with a plurality of reference voltages; and a control unit 13 to select one of the pulse width control codes to be provided to the pulse width adjusting unit 11 based on comparison data from the comparison unit 12.

In accordance with an embodiment of the inventive concept, the control unit 13 may calculate a probability density function (PDF) on the event that a level of an output signal is higher than a level of a reference voltage, based on comparison data with respect to each of the plurality of pulse width control codes, calculate a difference between the largest function value and the second-largest function value in the probability density function, and select one, having the smallest difference, from among the pulse width control codes to output it to the pulse width adjusting unit 11.

In accordance with an embodiment of the inventive concept, the control unit 13 may calculate a cumulative distribution function by counting the event that a level of an output signal is higher than a level of a reference voltage, with respect to a plurality of reference voltages and calculate the probability density function using the cumulative distribution function.

In accordance with an embodiment of the inventive concept, the input signal may be a data signal for transferring data using a pulse. An output signal of the duty cycle corrector 100 may be corrected to have a duty cycle of 50%.

There may be described duty cycle correcting device and method and a receiver using the same configured such that comparison data is acquired through comparison of each of pulse signals, having different duty cycles, with a plurality of reference voltage, a probability density function on each pulse signal is calculated based on the comparison data, and one of the pulse signals is selected using the probability density function.

In accordance with the duty cycle correcting device and method and the receiver using the same, a duty cycle may be corrected using a low-speed asynchronous signal the period of which is longer than that of an input pulse signal. Also, there may be corrected a duty cycle of a clock signal having regularly iterated pulses and a duty cycle of a data signal having irregular pulses. In the event that a duty cycle of a data signal is corrected to have 50%, a jitter noise of a pulse signal may be reduced and a bit error rate (BER) may be reduced. Thus, the performance of a communications system may be improved.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A duty cycle correcting device comprising:
   a pulse width adjusting unit which adjusts a pulse width of an input signal according to a pulse width control code;
   a comparison unit which compares an output signal of the pulse width control unit with a plurality of reference voltages; and
   a control unit which selects one of a plurality of pulse width control codes based on comparison data from the comparison unit and provides the selected pulse width control code to the pulse width adjusting unit,
   wherein the control unit calculates a probability density function, associated with each of the plurality of pulse width control codes based on the comparison data, calculates a difference between the largest function value and the second-largest function value in the probability density function, and selects one, having the smallest difference, from among the plurality of pulse width control codes to output the selected pulse width control code to the pulse width adjusting unit.

2. The duty cycle correcting device of claim 1, wherein the comparison unit compares a level of the output signal with a level of a reference voltage at a rising or falling transition time of a clock signal.

3. The duty cycle correcting device of claim 2, wherein the clock signal is an asynchronous signal the period of which is different from that of the input signal.

4. The duty cycle correcting device of claim 1, further comprising:
  a sampling unit which samples the output signal periodically, and
  wherein the comparison unit compares a sample signal from the sampling unit with the plurality of reference voltages.

5. The duty cycle correcting device of claim 1, wherein the control unit changes a pulse width control code such that a pulse width of the output signal is changed to provide a plurality of pulse width control codes sequentially to the pulse width control unit.

6. The duty cycle correcting device of claim 1, wherein the control unit calculates a cumulative distribution function by counting the event that a level of the output signal is higher than a level of a reference voltage, with respect to each of the plurality of reference voltages and calculates the probability density function using the cumulative distribution function.

7. The duty cycle correcting device of claim 1, wherein the input signal is a data signal for transferring data using a pulse.

8. A duty cycle correcting device comprising:
  a pulse width adjusting unit which adjusts a pulse width of an input signal according to a pulse width control code;
  a comparison unit which compares an output signal of the pulse width control unit with a plurality of reference voltages;
  a control unit which selects one of a plurality of pulse width control codes based on comparison data from the comparison unit and provides the selected pulse width control code to the pulse width adjusting unit; and
  a reference voltage signal generator which receives a reference voltage control code from the control unit and generates a signal having a voltage set by the reference voltage control code, the signal being input to the comparison unit.

9. The duty cycle correcting device of claim 8, wherein the control unit changes the reference voltage control code such that a voltage of a signal from the reference voltage signal generator is changed to control such that the plurality of reference voltages is sequentially provided to the comparison unit.

10. A duty cycle correcting method comprising:
  adjusting a pulse width of an input signal according to a pulse width control code, through a pulse width adjusting unit;
  comparing an output signal of the pulse width control unit with a plurality of reference voltages, through a comparison unit;
  selecting one of a plurality of pulse width control codes based on comparison data from the comparison unit, through a control unit; and
  providing the selected pulse width control code to the pulse width adjusting unit through the control unit,
  wherein the selecting comprises:
    calculating a probability density function, associated with each of the plurality of pulse width control codes based on the comparison data through the control unit;
    calculating a difference between the largest function value and the second-largest function value in the probability density function through the control unit; and
    selecting one, having the smallest difference, from among the plurality of pulse width control codes through the control unit.

11. The duty cycle correcting method of claim 10, wherein the comparing comprises:
  comparing a level of the output signal with a level of a reference voltage at a rising or falling transition time of a clock signal.

12. The duty cycle correcting method of claim 11, wherein the clock signal is an asynchronous signal the period of which is different from that of the input signal.

13. The duty cycle correcting method of claim 10, wherein the comparing comprises:
  sampling the output signal periodically through a sampling unit; and
  comparing a sample signal from the sampling unit with the plurality of reference voltages through the comparison unit.

14. The duty cycle correcting method of claim 10, wherein the calculating a probability density function comprises:
  calculating a cumulative distribution function by counting the event that a level of the output signal is higher than a level of a reference voltage, with respect to each of the plurality of reference voltages; and
  calculating the probability density function using the cumulative distribution function.

15. A receiver comprising:
  an equalizer which equalizes an input signal; and
  a duty cycle corrector which corrects a duty cycle of the equalized signal,
  wherein the duty cycle corrector comprises:
  a pulse width adjusting unit which adjusts a pulse width of an input signal according to a pulse width control code;
  a comparison unit which compares an output signal of the pulse width control unit with a plurality of reference voltages; and
  a control unit which selects one of a plurality of pulse width control codes based on comparison data from the comparison unit,
  wherein the control unit calculates a probability density function, associated with each of the plurality of pulse width control codes based on the comparison data, calculates a difference between the largest function value and the second-largest function value in the probability density function, and selects one, having the smallest difference, from among the plurality of pulse width control codes to output the selected pulse width control code to the pulse width adjusting unit.

16. The receiver of claim 15, wherein the control unit calculates a cumulative distribution function by counting the event that a level of the output signal is higher than a level of a reference voltage, with respect to each of the plurality of reference voltages and calculates the probability density function using the cumulative distribution function.

17. A non-transitory computer-readable storage medium configured to store a program for executing a duty cycle correcting method comprising:

adjusting a pulse width of an input signal according to a pulse width control code, through a pulse width adjusting unit;
comparing an output signal of the pulse width control unit with a plurality of reference voltages, through a comparison unit;
selecting one of a plurality of pulse width control codes based on comparison data from the comparison unit, through a control unit; and
providing the selected pulse width control code to the pulse width adjusting unit through the control unit,
wherein the selecting comprises:
calculating a probability density function, associated with each of the plurality of pulse width control codes based on the comparison data through the control unit;
calculating a difference between the largest function value and the second-largest function value in the probability density function through the control unit; and
selecting one, having the smallest difference, from among the plurality of pulse width control codes through the control unit.

* * * * *